United States Patent [19]
Brigham et al.

[11] Patent Number: 5,342,808
[45] Date of Patent: Aug. 30, 1994

[54] APERTURE SIZE CONTROL FOR ETCHED VIAS AND METAL CONTACTS

[75] Inventors: Kristen Brigham, Palo Alto; Gary W. Ray, Mountain View, both of Calif.

[73] Assignee: Hewlett-Packard Company, Palo Alto, Calif.

[21] Appl. No.: 28,643

[22] Filed: Mar. 9, 1993

Related U.S. Application Data

[63] Continuation of Ser. No. 849,934, Mar. 12, 1992, abandoned.

[51] Int. Cl.⁵ .................... H01L 21/302; H01L 21/311
[52] U.S. Cl. ...................... 437/228; 437/195; 156/644; 156/657
[58] Field of Search ................ 437/228, 195, 238; 156/657, 644

[56] References Cited

U.S. PATENT DOCUMENTS

| | | | |
|---|---|---|---|
| 4,641,420 | 2/1987 | Lee | 148/DIG. 20 |
| 4,868,138 | 9/1989 | Chan et al. | 437/44 |
| 4,872,947 | 10/1989 | Wang et al. | 437/238 |
| 4,902,533 | 2/1990 | White et al. | 437/228 |
| 4,910,170 | 3/1990 | Motozima et al. | 437/228 |
| 4,952,524 | 8/1990 | Lee et al. | 437/67 |
| 5,118,382 | 6/1992 | Cronin et al. | 156/643 |

*Primary Examiner*—T. N. Quach

[57] ABSTRACT

A method for reduction and control of the size of etched apertures and vias for integrated circuit devices. A first aperture having a horizontal dimension greater than a desired aperture dimension is etched in an insulating layer. The sidewalls and bottom surface of the first aperture are then lined with a conformal material such as ozone/TEOS or silicon nitride, and the conformal material is anistropically etched. The anisotropic etch removes the conformal material from the bottom surface, but leaves an amount of conformal material on the sidewalls to reduce the horizontal dimension to the desired aperture dimension. Where ozone/TEOS is used, the conformal layer may be formed at relatively low temperatures such as $T = 390°$ C.

7 Claims, 2 Drawing Sheets

5,342,808

APERTURE SIZE CONTROL FOR ETCHED VIAS AND METAL CONTACTS

CROSS REFERENCE TO RELATED APPLICATION(S)

This is a continuation of copending application Ser. No. 07/849,934 filed on Mar. 3, 1992, now abandoned.

TECHNICAL FIELD

This invention relates to preparation of apertures in insulator materials and control of diameters of the apertures.

BACKGROUND ART

In fabricating an integrated circuit, apertures, windows or vias are often formed in a layer of insulator material in order to provide a contact to a second layer to electrically connect the second layer to a third layer that is on an opposite side of the insulator layer. Because real estate is precious on a semiconductor device, the dimensions of these apertures are often made as small as fabrication limitations allow. It is necessary to precisely control the diameter of any aperture that is formed in a layer.

A conventional technique for forming an aperture through an insulator layer to provide access to a lower level conductive layer is to apply or spin a photoresist to the insulator layer and to pattern the photoresist using a photolithographic mask to expose regions of the insulator layer. Plasma etching or reactive ion etching then removes material from the insulator layer, forming apertures at the exposed regions. After removal of the photoresist, a conductive material is deposited within the apertures to electrically connect with the lower level conductive layer. Various factors limit the minimum horizontal dimension of an aperture formed in this manner. For example, aperture size is limited by the resolution of the lithography. In addition to problems involving the size of the aperture, there can be problems with misalignment to the lower conductive layer. Optimally, formation of the apertures during fabrication of a semiconductor device should allow rework if the apertures are inaccurately placed or are formed outside of acceptable dimensional tolerances.

U.S. Pat. No. 4,910,168 to Tsai teaches that contacts through an insulator layer can be formed without etching the layer. Originally the layer is a conductive polysilicon layer, but subsequent processing oxidizes the polysilicon layer other than at contact regions. The oxidation converts the conductive polysilicon to an insulating material, other than at the contact regions. While this method offers advantages over the conventional technique, the advantages are available only in semiconductor applications in which the oxidized doped polysilicon possesses the specific structural and electrical properties of the particular application.

The object of the present invention is to provide a method for controlling the horizontal dimension of an aperture in an insulator layer and for reducing a contact to a size which could not otherwise be achieved because of the limits of lithography, wherein the aperture provides access to a lower conductive layer.

SUMMARY OF THE INVENTION

The above object has been met by a method that includes formation of a first aperture in a layer of insulator material formed on a conductive underlayer, with the first aperture having a diameter (D') that is greater than the desired diameter (D) of an end-product aperture, but having a depth (d') that is less than or equal to the desired depth (d) of the end-product aperture. After formation of the first aperture, a conformal layer of a suitable oxide, preferably deposited from an ozone/tetraethylorthosilicate mixture ("ozone/TEOS"), is used to uniformly coat the surfaces of the first aperture and the upper surface of the insulator layer. The thickness of this conformal oxide layer on each sidewall of the first aperture is approximately $(D'-D)/2$. The conformal oxide layer is then anisotropically etched so that the resulting depth of the aperture exposes the conductive underlayer and the diameter of the end-product aperture is approximately D. A dry etch, preferably a plasma or a reactive ion etch (RIE), provides the desired anisotropic (i.e., directional) mechanism that removes the conformal oxide layer from the upper surface of the insulator layer and from the bottom of the aperture, but leaves a coating of conformal oxide layer on the sidewalls of the aperture.

The aperture through the insulator layer may then be filled with an electrically conducting material, such as a metal or a highly doped semiconductor material, so that the material that fills the aperture provides an electrically conducting path or via to the conductive underlayer.

If an etchant that is used in removing the portion of the conformal layer that is at the bottom surface of the first aperture has less than 100 percent directionality with respect to removal of conformal material at the bottom surface, the initial dimensions of the first aperture can be varied to compensate for material removed from the sidewalls. The aperture may have any shape desired for interconnection, as for example apertures which are approximately circular, oval-shaped or polygonal. The material used for deposit may be any insulating material that has good conformality, such as silicon nitride ($Si_3N_4$).

The invention allows reworking of etched contacts. However, resist residue lying in the aperture is normally not present and ultra-clean contact surfaces can be produced by the invention. Where the first aperture is formed to a depth (d') that is less than the depth of the end-product aperture, the contact surface of the conductive underlayer remains protected by a thin covering of the insulator material until completion of the formation of the end-product aperture. During photoresist removal, which is commonly a form of plasma processing, the contact surface is protected by this thin covering. That is, only once is the contact surface exposed to a potentially damaging RIE process. The invention also allows the practical lower limit on lithography to be reduced.

BEST MODE FOR CARRYING OUT THE INVENTION

Figure 1A:
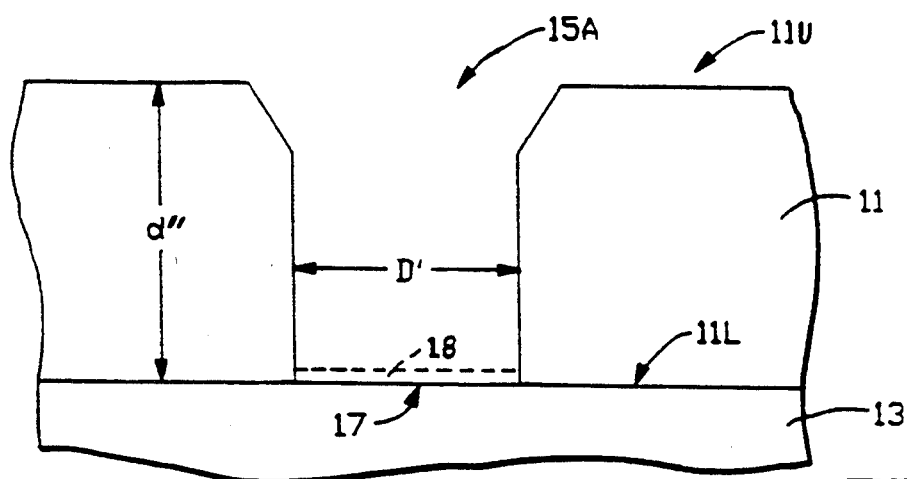
FIG. 1A is a schematic side view of a first aperture etched into a layer of insulator material as part of the method of the present invention.

With reference to FIG. 1A, a layer 11 of insulator material having an upper surface 11U and a lower surface 11L rests on an underlayer 13 of conductive material. The insulator layer may be silicon dioxide, phosphosilicate glass, or any other material which provides electrical isolation. The conductive underlayer may be a metallic layer or may be a semiconductor layer that has been heavily doped.

An aperture 15A is formed in the insulator layer 11 using conventional techniques. For example, a layer of photoresist, not shown, may be deposited on the upper surface 11U of the insulator layer and may be patterned to expose the region of the insulator layer that is to be removed for formation of the aperture 15A. Reactive ion etching (RIE), plasma etching, or any other technique which provides anisotropic etching is then utilized to remove exposed insulator material, whereafter the photoresist is stripped. The aperture 15A is referred to herein as a "first aperture," since the diameter D′ is greater than the desired diameter of an end-product aperture to be fabricated using the present invention. However, while the diameter D′ is greater than the desired diameter, the depth d″ may be less than the desired depth. The desired depth is a depth that exposes a region 17 of the conductive underlayer 13, as shown in FIG. 1A, but formation of the first aperture 15A optionally leaves a portion of the insulator material 11 that covers the region 17. This portion that is optionally left is shown in phantom at 18. The optional portion protects the contact surface of the conductive underlayer.

Figure 1B:
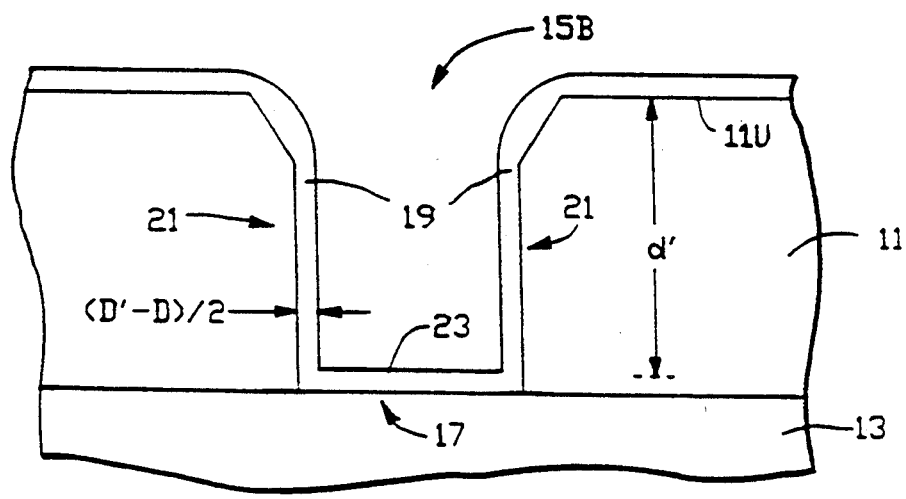
FIG. 1B is a schematic side view of a first aperture in FIG. 1A after a conformal layer has been deposited.

Referring now to FIG. 1B, a thin conformal layer 19, preferably of ozone/TEOS, is then deposited on all of the exposed surfaces. Ozone/TEOS is highly conformal and can be used to deposit films having approximately uniform thicknesses as low as 200 angstroms. The deposit of such materials is described in U.S. Pat. No. 4,872,947 to Wang et al. Deposition can occur at temperatures as low as 390° C., so that ozone/TEOS is a relatively low temperature material.

"Conformal material" is defined herein as an electrically insulating material that conforms to the topography of a layer to be coated and that allows a thin coating of approximately uniform thickness to be laid down on the layer to be coated. The selected conformal material must be compatible with the materials and processes used in fabricating the desired circuit. It is possible to use silicon nitride ($Si_3N_4$) or other insulating materials that are highly conformal when deposited in small, uniform thicknesses. However, some of these conformal materials, and $Si_3N_4$ especially, require use of temperatures as high as 800° C. to provide a thin, conformal layer of reasonably uniform thickness.

The conformal layer 19 at each sidewall 21 has a thickness of approximately 50% of the difference between the first diameter D′ and a desired diameter D. That is, each sidewall has a coating approximately equal to (D′−D)/2. The deposit of the conformal layer provides a coating 23 of material that reduces the depth d′ of the aperture 15B, as measured from the upper surface 11U of the insulator layer 11.

Figure 1C:
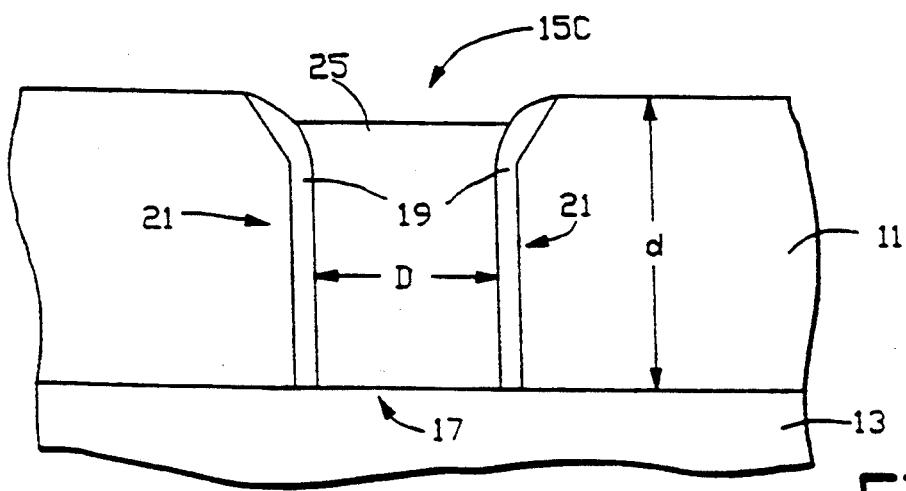
FIG. 1C is a schematic view of a metal-filled aperture fabricated according to the present invention.

Anisotropic selective dry etching is then performed within the aperture 15B, whereby the bottom coating 23 formed by the conformal layer is removed and little or no material is etched from the sidewalls 21 of the insulator layer 11. The end-product aperture 15C is shown in FIG. 1C. Because the conformal material 19 on the two sidewalls 21 has a combined thickness that is the difference between the first diameter D′ and the desired diameter D, the aperture 15C has the desired diameter. The anisotropic etching of the bottom coating 23 and any insulator material 11 that may lie underneath the bottom coating provides a depth d as desired. The aperture is then filled with a conductive material 25 to form a contact.

The above description assumes that the anisotropic selective etch has a 100% discrimination against etching of the conformal material 19 on the sidewalls 21, so that no conformal material is etched from the sidewalls during removal of the bottom coating 23. That is, the assumption is that the fraction (f) which represents selectivity is 1, where 1 represents a 100% discrimination. If the selectivity is a fraction $f<1$, so that the conformal material 19 on the sidewalls 21 is etched during removal of the bottom coating, the conformal layer must have a greater thickness than described above. The additional thickness should be equal to the amount of sidewall etching that occurs during removal of the bottom coating 23. Thus, the conformal material 19 on each sidewall should have an initial thickness of $(D'-D)/2+(1-f)(d-d')$, where d is the desired aperture depth and d′ is the aperture depth prior to removal of the bottom coating 23. For example, where there is an 80% discrimination against etching of the sidewall conformal material 19, the thickness of the conformal material on each sidewall should be $(D'-D)/2+(1-0.8)(d-d')$. This addition of $(1-f)(d-d')$ to the thickness of the conformal material 19 also applies to sidewalls that are not vertical, since an anisotropic etch will remove a portion of the conformal material from sidewalls that include a horizontal component of direction, with the portion being dependent upon the magnitude of the horizontal component.

It has been discovered that use of a special reaction mixture of ozone/TEOS allows deposition of a high quality silica film, where the ozone/TEOS layer is highly conformal and can be used to coat small diameter apertures. The approach described above can provide accurately aligned contacts and can allow rework of previously etched apertures, if the etched apertures have not been filled with an electrically conducting material 25 as shown in FIG. 1C.

Figure 2:
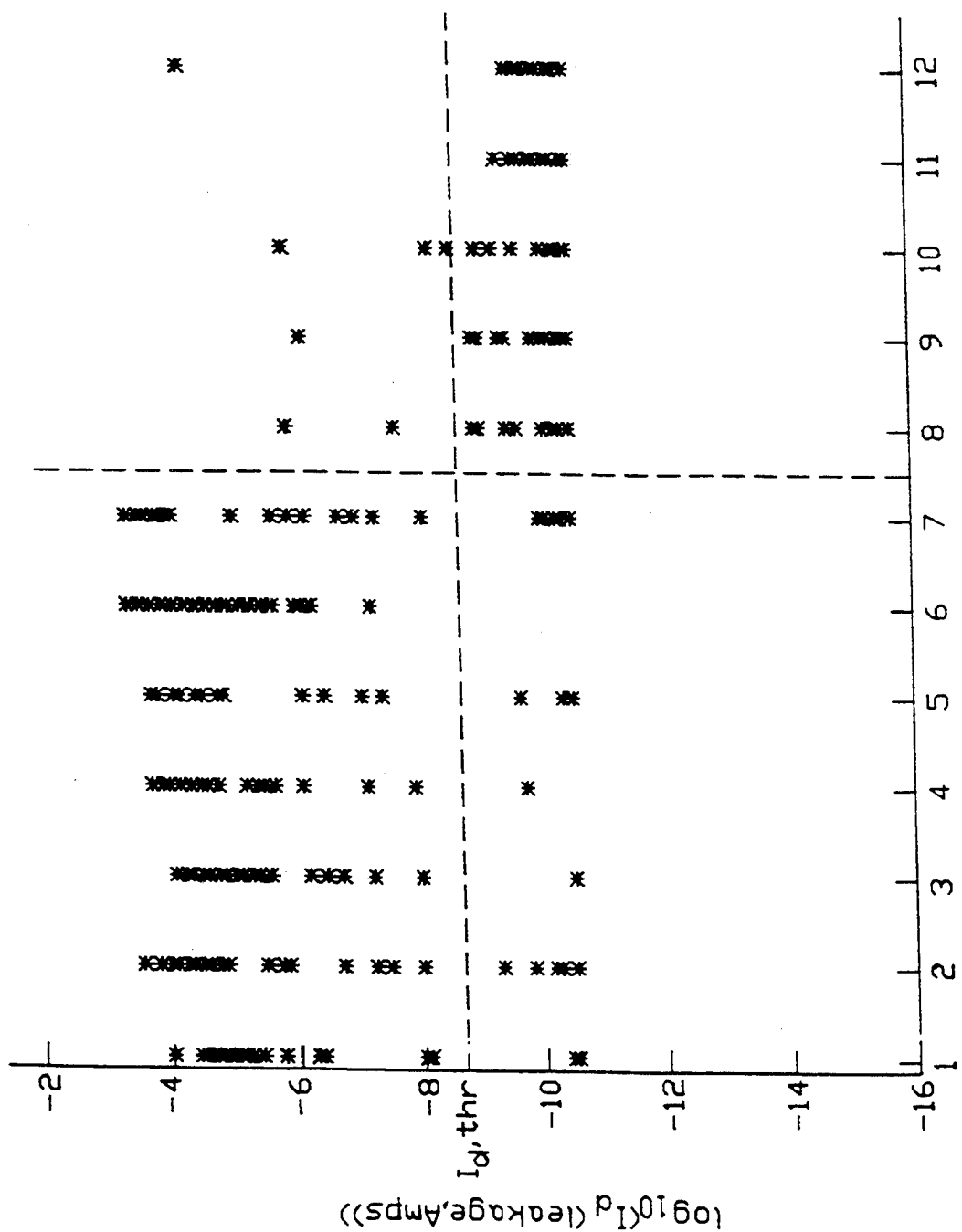
FIG. 2 is a graphical comparison of the results of diode current leakage measurements made on seven wafers of diodes fabricated conventionally and five wafers of diodes fabricated according to the present invention.

FIG. 2 exhibits the logarithm of measured diode leakage current, $\log_{10} I_d$ (amps) for each of twelve wafers with 20 diodes tested per wafer. The horizontal dotted line corresponding to $I_{d,thr}=5\times10^{-9}$ amps is the specification limit for acceptable diode current leakage. The first seven wafers (nos. 1–7) were prepared using conventional etching techniques, and each of these wafers has 80–95% of the diodes with $I_d>I_{d,thr}$. Each of the next five wafers (nos. 8–12) has $I_d>I_{d,thr}$ for 0–10% of the diodes, with the apertures prepared using the present invention and with ozone/TEOS as the conformal material. Although use of the present invention does not reduce current leakage for all diodes to current values $I_d<I_{d,thr}$, the improvement is significant.

Several other advantages accrue from use of this method. First, the alignment tolerances for lithography in a submicron geometry are eased because the final aperture diameter can be varied to partly compensate for misalignment. As an example, where misalignment has caused an aperture to have an edge portion that extends onto a field oxide region, the etching of the insulator layer to form the aperture will also remove oxide from the field oxide region, thereby exposing a sidewall of the conductive underlayer. Utilizing only prior art techniques, this would result in unacceptable diode leakage current. However, by utilizing the present invention, the removed portion of the field oxide region is filled with the conformal material to again properly cover the sidewall of the conductive underlayer. Second, the conformal layer method provides a method for reworking a "finished" aperture in which the aperture diameter is too large. Third, this method allows in-process adjustment of certain aperture parameters to take account of or compensate for variation of parameters in one or more of the steps preceding aperture formation. Fourth, apertures with aspect ratios as high as 5:1 are achievable because of the high conformality of the ozone/TEOS layer. Fifth, the temperature used for laying down a conformal layer of ozone/TEOS is relatively low, as low as T=390° C. Sixth, resist residue lying in an aperture can be removed before complete etching, and ultra-clean surfaces can be produced. Finally, where the first aperture is formed in a manner that leaves an amount of insulator material at the bottom of the aperture and where plasma processing strips the resist that is used in forming the first aperture, the contact surface of the conductive underlayer will be exposed to RIE only upon formation of the end-product aperture. Etching is believed to adversely affect such contact surfaces, but leaving an amount of the insulator material will protect the contact surface.

We claim:

1. A method for forming an aperture having a desired diameter D and a desired depth d in a layer of insulator material, the method comprising the steps of:
   providing an insulator layer on an electrically conductive underlayer, the insulator layer having an upper surface;
   forming a first aperture in the insulator layer to have sidewalls such that a major portion of the sidewalls has a diameter $D'$ that is greater than the desired diameter D and to have a bottom surface such that the depth thereof relative to the upper surface of the insulator layer has a maximum value equal to the thickness of the insulator layer;
   depositing a uniform conformal layer of conformal insulating material in the first aperture at the bottom surface and sidewalls thereof such that the thickness of the conformal layer on each sidewall is approximately $(D'-D)/2$; and
   anisotropically etching the uniform conformal insulating material of the first aperture such that the resulting depth of the resulting aperture relative to the upper surface of the insulator layer is approximately d and a major portion of the sidewalls has a diameter D, thereby providing access to the electrically conductive underlayer.

2. The method of claim 1, further comprising the step of depositing a selected electrically conducting material in the resulting aperture.

3. The method of claim 1, further comprising the step of choosing the conformal insulating material as primarily silicon nitride.

4. The method of claim 1 further comprising filling the aperture formed by said anisotropically etching the conformal insulating material, wherein filling the aperture is with an electrically conductive material and is at a height less than the height of the aperture.

5. A method for forming an aperture having a desired diameter D and a desired depth d in a layer of insulator material, the method comprising the steps of:
   providing an insulator layer on an electrically conductive underlayer, the insulator layer having a horizontal upper surface;
   selecting a value $D''$ that is greater than the value D of the desired diameter;
   forming a first aperture in the insulator layer such that opposed sides of said aperture along a substantial portion of the height thereof are separated by a distance approximately equal to the value $D''$ and such that said aperture has a horizontal bottom surface wherein in the distance from the horizontal upper surface to the horizontal bottom surface has a maximum value equal to the desired depth d;
   uniformly depositing a conformal layer of conformal insulating material onto the horizontal bottom surface and sides wherein the thickness of the conformal layer along the sides is based on the selectivity of etching the uniform conformal layer on the horizontal bottom surface relative to etching the uniform conformal layer on the sides; and
   anisotropically etching the uniform conformal layer on the horizontal bottom surface and sides to remove conformal insulating material at the horizontal bottom surface to expose the electrically conductive underlayer and to remove a fraction of the thickness of uniform conformal insulating material disposed on the sides so that a major portion of the sides has the desired diameter D.

6. The method of claim 5 further comprising the step of depositing an electrically conducting material in the aperture after the step of anisotropically etching.

7. The method of claim 5 further comprising the step of choosing said conformal insulating material as primarily silicon nitride.

* * * * *